(12) United States Patent
Edwards

(10) Patent No.: US 6,762,865 B1
(45) Date of Patent: Jul. 13, 2004

(54) SELF-REFERENCED HOLOGRAPHY USING DIFFUSIVE ELEMENT

(75) Inventor: Jathan D. Edwards, Afton, MN (US)

(73) Assignee: Imation Corp., Oakdale, MN (US)

( * ) Notice: Subject to any disclaimer, the term of this patent is extended or adjusted under 35 U.S.C. 154(b) by 0 days.

(21) Appl. No.: 10/360,431

(22) Filed: Feb. 7, 2003

(51) Int. Cl.[7] .............................................. G03H 1/16
(52) U.S. Cl. ........................... 359/29; 359/22; 359/30; 359/31; 359/35; 365/125; 365/216
(58) Field of Search ........................ 359/10, 11, 22, 359/24, 25, 35, 29–31; 365/125, 216, 234

(56) References Cited

U.S. PATENT DOCUMENTS

| | | | |
|---|---|---|---|
| 3,917,380 A | * 11/1975 | Kato et al. | ...................... 359/35 |
| 4,104,489 A | * 8/1978 | Satoh et al. | ................ 369/103 |
| 5,307,184 A | * 4/1994 | Nishiwaki et al. | ............ 359/30 |
| 5,719,691 A | 2/1998 | Curtis et al. | |
| 6,538,776 B2 | 3/2003 | Edwards | |
| 6,674,555 B1 | * 1/2004 | Curtis et al. | ................... 359/29 |

* cited by examiner

Primary Examiner—Drew A. Dunn
Assistant Examiner—Leo Boutsikaris
(74) Attorney, Agent, or Firm—Eric D. Levinson

(57) ABSTRACT

The invention is directed to self-referenced holographic recording techniques that make use of a diffusive element. Self-referenced holography refers to holographic recording techniques in which a reference beam is created from a zero frequency Fourier component of a data encoded object beam. In accordance with the invention, a diffusive element can be positioned in a holographic recording system to create the reference beam from the zero frequency Fourier component of the data encoded object beam. Using a diffusive element to create a reference beam in self-referenced holography can provide advantages to the self-referenced holographic recording system.

29 Claims, 4 Drawing Sheets

US 6,762,865 B1

SELF-REFERENCED HOLOGRAPHY USING DIFFUSIVE ELEMENT

TECHNICAL FIELD

The invention relates to holography and, more particularly, to holographic data storage.

BACKGROUND

Many different types of data storage media have been developed to store information. Traditional data storage media, for instance, include magnetic media, optical media, and mechanical media to name a few. Increasing data storage density is a paramount goal in the development of new or improved types of data storage media.

In traditional media, individual bits are stored as distinct mechanical, optical, or magnetic changes on the surface of the media. For this reason, medium surface area generally poses physical limits on data densities of traditional media.

Holographic data storage media can offer higher storage densities than traditional media. In a holographic medium, data is stored throughout the volume of the medium rather than the medium surface. Moreover, data can be superimposed within the same medium volume using multiplexing techniques. For these reasons, theoretical holographic storage densities can approach tens of terabits per cubic centimeter.

In holographic data storage media, entire pages of information, e.g., bit maps, can be stored as optical interference patterns within a photosensitive optical material. This is done by intersecting two coherent laser beams within the optical material. The first laser beam, called the object beam, contains the information to be stored; and the second, called the reference beam, interferes with the object beam to create an interference pattern that can be stored in the holographic recording material as a hologram. In most conventional holographic recording systems, the object beam and reference beam ordinarily follow separate optical paths.

When a stored hologram is illuminated with only the reference beam, some of the reference beam light is diffracted by the hologram interference pattern. Moreover, the diffracted light can be directed to reconstruct the original object beam. Thus, by illuminating a recorded hologram with the reference beam, the data encoded in the object beam can be reconstructed and detected by a data detector such as a camera.

Self-referenced holography as described in U.S. patent application Ser. No. 09/813,066, filed Mar. 20, 2001 for Jathan Edwards entitled "Self-Referenced Holographic Storage," can improve holographic data storage systems. In self-referenced holography, the object beam and reference beam follow a common optical path. In particular, in self-referenced holography, the reference beam is created from a zero frequency Fourier component of the object beam. As described in U.S. patent application Ser. No. 09/813,066, the creation of the reference beam from the zero frequency Fourier component of the object beam can be achieved using a lens or a mirror. The entire content of U.S. patent application Ser. No. 09/813,066 is incorporated herein by reference.

For example, a lens can be positioned in the optical path of the object beam before the medium to optically direct the zero frequency component of the object beam in order to create a reference beam. Alternatively, a mirror can be positioned in the optical path of the object beam after the medium to optically reflect the zero frequency component of the object beam after it passes through the medium. Generally, self-referenced holography can yield a number of advantages in a holographic data storage system, including the realization of a single optical path directed toward a holographic recording medium which can reduce the size of the system and possibly reduce alignment concerns.

SUMMARY

In general, the invention is directed to self-referenced holographic recording techniques that make use of a diffusive element. In particular, the diffusive element can be positioned in a holographic recording system to create a reference beam from a zero frequency Fourier component of a data encoded object beam. The diffusive element may randomly diffuse the zero frequency Fourier component, or may diffuse the zero frequency Fourier component in an ordered or partially ordered manner. For example, the diffusive element may be designed to create a reference beam having particular angles, phase and amplitude. Such techniques may improve storage capacity of a holographic medium by improving multiplexing of stored holograms in the medium. Multiplexing refers to techniques used to store substantially overlapping holograms in the volume of the holographic recording medium.

In one embodiment, the invention provides a method comprising optically directing a zero frequency Fourier component of a data encoded object beam using a diffusive element to create a reference beam, and illuminating a holographic medium with the reference beam and non-zero frequency Fourier components of the data encoded object beam. In particular, the zero frequency Fourier component of the data encoded object beam, i.e., the reference beam, can interfere with higher order Fourier components of the data encoded object beam to create a hologram in the medium.

In another embodiment, the invention provides a holographic data storage system comprising a holographic medium, and a diffusive element positioned to create a reference beam from a zero frequency Fourier component of a data encoded object beam, wherein the reference beam and non-zero frequency Fourier components of the object beam interfere in the holographic medium to create a hologram.

In an added embodiment, the invention provides a method comprising optically directing a zero frequency Fourier component of the first optical beam using a phase mask to create a second optical beam, and illuminating a holographic medium with the second optical, beam and non-zero frequency Fourier components of the first optical beam.

The different embodiments may provide one or more advantages. In particular, self-referenced holography can realize a holographic system having a single optical path. In addition, removing the zero frequency Fourier component from an object beam to create a reference beam can reduce undesirable intensity of the object beam. In other words, removing the zero frequency Fourier component of the object beam can reduce or avoid undesirable overexposure of photosensitive holographic recording material during holographic recording by reducing the total energy transmitted to the recording material via the object beam.

In addition, use of a diffusive element in self-referenced holography can further improve the holographic system. The diffusive element may create a reference beam having controlled characteristics, such as phase, angles, and intensity. For example, use of a diffusive element in the form of a phase mask can realize a reference beam having phase content that improves the ability to multiplex data stored in the holographic recording medium. Multiplexing refers to a process of recording two or more holograms in the same volume of the medium, e.g., in an overlapping or partially overlapping manner. By using a diffusive element to create a reference beam with particular angles, phase and amplitude, shift-multiplexing can be employed in order to increase the storage capacity of holographic recording media and simplify the mechanical addressing of individual holograms stored by the holographic recording system. In particular, the ability to reconstruct shift-multiplexed holograms with higher selectivity, i.e., higher storage density, may be enabled by a reference beam created to have defined characteristics of phase, angles, amplitude, and the like.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
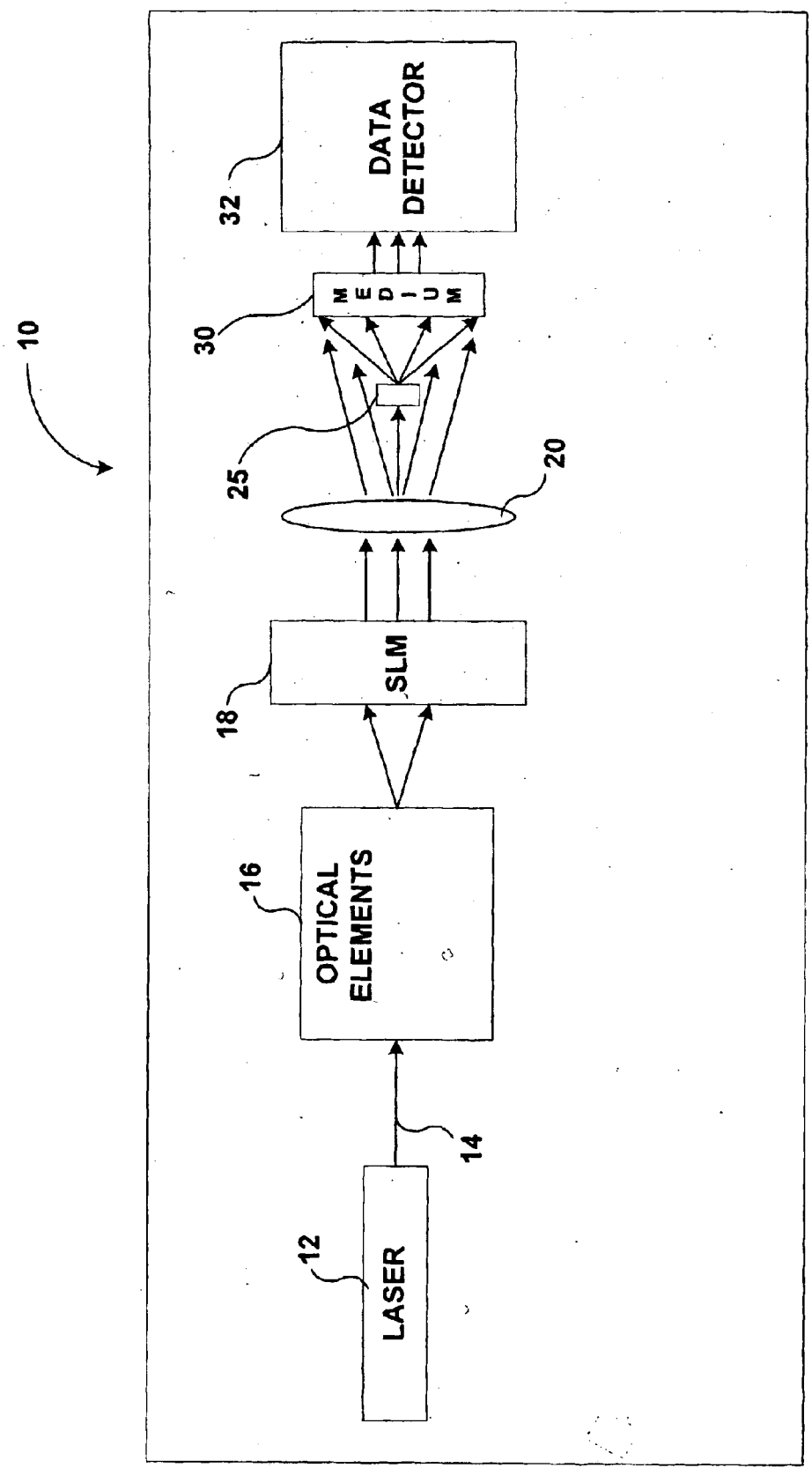
FIG. 1 is a block diagram of a self-referenced holographic recording system according to an embodiment of the invention.

The invention is directed to self-referenced holographic recording techniques that make use of a diffusive element. Self-referenced holography refers to holographic recording techniques in which a reference beam is created from a zero frequency Fourier component of a data encoded object beam. In particular, the zero frequency Fourier component of a data encoded object beam can be optically directed so as to interfere with the higher order components of the object beam in order to create holograms in a holographic medium. In other words, the reference beam comprises the zero frequency Fourier component of a data encoded object beam, and interferes with non-zero frequency Fourier components of the object beam to create holograms in the holographic medium.

By creating the reference beam from the zero frequency Fourier component of the object beam, a holographic system having a single optical path can be realized. The zero frequency component of the object beam does not contain image information pertaining to the specifics of the data encoded. As a result, the zero frequency Fourier component of the object beam may define an intensity that can consume photosensitive holographic recording material without making contribution to the information contained in the object beam. Thus, by removing the zero frequency Fourier component of the object beam and using the zero frequency Fourier component as a reference beam, undesirable overexposure of photosensitive holographic recording material can be eliminated or reduced.

In accordance with the invention, a diffusive element can be positioned in a holographic recording system to create a reference beam from a zero frequency Fourier component of a data encoded object beam. Use of a diffusive element to create a reference beam from a zero frequency Fourier component of a data encoded object beam can provide certain advantages in holographic recording as outlined in greater detail below. In some examples, the diffusive element may randomly diffuse the zero frequency Fourier component. In other examples, the diffusive element may diffuse the zero frequency Fourier component in an ordered or defined manner, e.g., to create a reference beam having certain desirable characteristics.

In some cases, the diffusive element may be designed to create a reference beam with a particular angle, phase and amplitude, which can allow for improved multiplexing in the medium. Desirable phase of the reference beam, in particular, may improve multiplexing. Multiplexing refers to a process of recording two or more holograms in the same volume of the medium, e.g., in a substantially overlapping manner. By using a diffusive element to create a reference beam with particular angles, phase and amplitude, shift-multiplexing selectivity can be improved, which can increase the storage capacity and enable simplified media accessing mechanics. In particular, the ability to reconstruct multiplexed holograms may be improved if the reference beam is created to have controlled characteristics of phase, angles, amplitude, and the like. For shift-multiplexing, the recording techniques described herein, e.g., making use of a diffusive element in self-referenced holography, may be repeated at one or more shifted locations on the medium. Moreover, in some cases, shift multiplexing may be achieved by repeating self-referenced recording following shift of only the diffusive element relative to the holographic medium.

Typical multiplexing techniques used for holographic data storage include variations or combinations of angle, wavelength or shift multiplexing methods. As selectivity (between holograms) of the multiplexing increases, greater storage density can be achieved. This selectivity varies inversely with the correlation of the reference beam as used to record the differing overlapped holograms. In angle multiplexing, multiple holograms are differentiated as having been recorded with differing inclination angles relative to the media between the reference and object beams used to record the hologram. Readout of angle multiplexed holograms generally requires a precise reorientation of the reference beam relative to the media in order to match the initial recording condition.

In wavelength multiplexing, the differentiation between holograms is controlled by adjusting the wavelength of the coherent source for both object and reference beams used for recording. Subsequent readout of the multiple holograms generally requires replication of the precise wavelengths used during the previous recording step.

In shift multiplexing, the reference beam incorporates enough angular and/or phase content such that lateral shifts of the media relative to the recording beams for each hologram provides differentiation. Subsequent readout using the shift multiplexing method generally requires the reference beams lateral position relative to the media to match the previous recording condition. Since the lateral positioning of head relative to media is more routinely implemented in a drive mechanism, the shift multiplexing method may be more advantageous relative to angle or wavelength multiplexing.

FIG. 1 is a block diagram of a self-referenced holographic recording system 10 according to an embodiment of the invention. As shown in FIG. 1, holographic recording system 10 includes a laser 12 that produces laser light 14. Light 14 passes through various optical elements 18, such as lenses, mirrors, filters or the like, to condition light 14 for effective data encoding.

A data encoder such as spatial light modulator (SLM) 18 is used to encode data in light 14. In particular, SLM 18 may encode a holographic bit map, e.g., a pixel array, in the light. The data encoded light is referred to as the object beam, as known in the art of holographic recording. A Fourier transform lens 20 is positioned to cause Fourier decomposition of the data encoded object beam.

Diffusive element 25 is positioned to optically direct the zero frequency Fourier component of the data encoded object beam to create a reference beam. This reference beam created from the zero frequency Fourier component of the object beam interferes in medium 30 with the higher order components of the object beam. In other words, the reference beam interferes in medium 30 with the non-zero frequency Fourier components of the object beam. In this manner, holograms of the bit maps encoded on the object beam can be stored in medium 30.

By way of example, medium 30 may take the form of a disk or a card, although the scope of the invention is not limited in that respect. A disk-shaped medium, for instance, may have a sandwich construction in which a photosensitive material is sandwiched between two substrate portions. The substrate portions may comprise polycarbonate, polymethylmethacrylate (PMMA), amorphous polyolefin, glass or the like, and outer surfaces of one or both of the substrate portions may be coated with an anti-reflective coating. The photosensitive material of medium 30 may comprise a matrix polymer resulting from the mixture of two or more oligomeric components. A photoinitiator can be mixed in a first oligomeric component, and a write monomer can be mixed in a second oligomeric component. One or more additives may also be dissolved in the oligomeric components. In other embodiments, however, medium 30 may assume any of a wide variety of other holographic recording configurations.

A data detector 32 such as a camera, may be positioned to detect stored holograms on medium 30 when medium 30 is illuminated by the reference beam only. In that case, only the zero frequency Fourier component, i.e., the reference beam, may illuminate medium 30 so that bit maps encoded on the object beam and stored in medium 30 can be reconstructed. A filter, mask, opaque element, or the like (not shown) may be used to block the higher order components of the object beam during readout, so that medium 30 can be illuminated by the reference beam only during readout, to facilitate reconstruction of the object beam.

Figure 2:
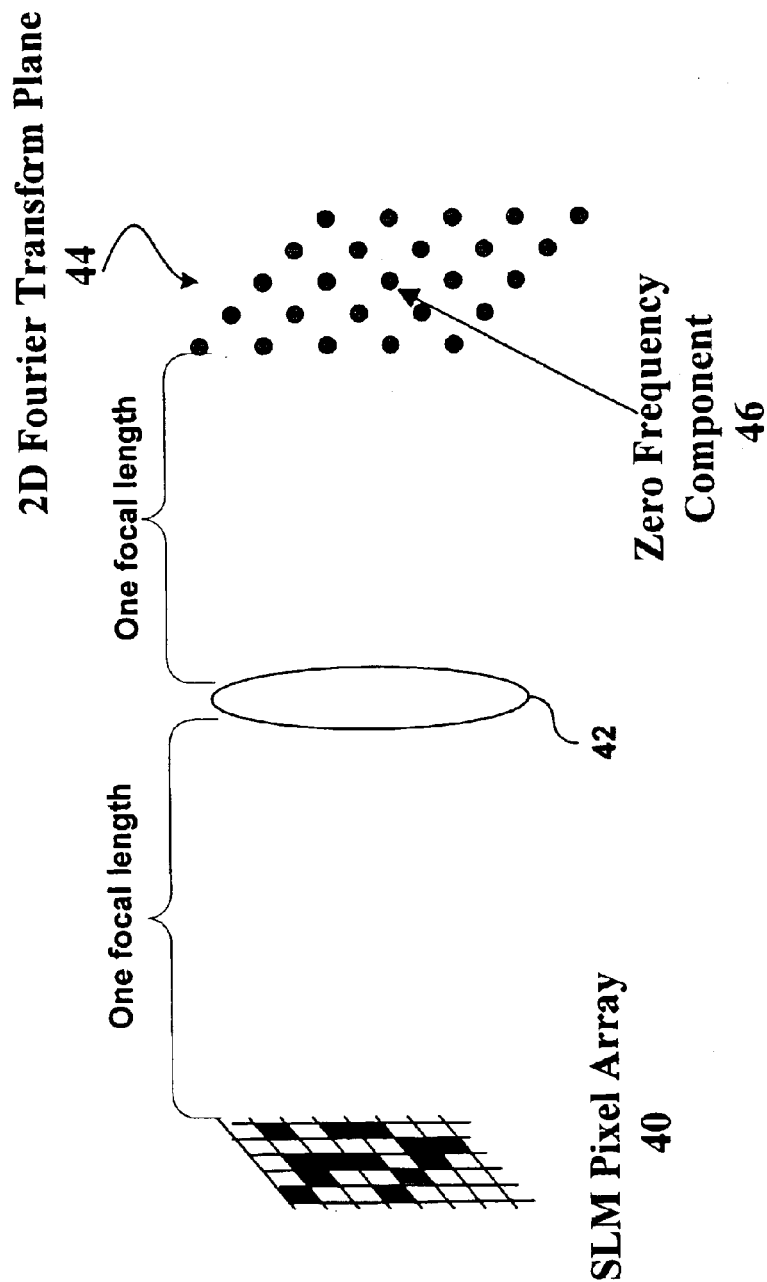
FIG. 2 is a conceptual diagram illustrating Fourier decomposition of a pixel array.

To better explain self-referenced holographic recording, a basic description of Fourier decomposition will now be provided. FIG. 2 is used to help describe Fourier decomposition. As shown in FIG. 2, an exemplary SLM pixel array 40 can be encoded as a bit map on an object beam. In particular, an SLM may be used to define pixel array 40, which may have various shapes, sizes or numbers of pixels. After passing through the SLM, the object beam may then pass through a Fourier transform lens 42 located one focal length from the SLM 40. At a distance of one additional focal length from the lens 42, the data encoded object beam appears as a collection of Fourier components in a Fourier transform plane 44. In accordance with the invention, a diffusive element may be used to diffuse the zero frequency Fourier component 46 in a random or ordered fashion.

The Fourier components contain all of the information of SLM pixel array 40. However, the encoded data is contained in the "higher order components" of the Fourier spectrum. The zero-frequency (or DC) component 46 that resides in the center of the Fourier spectrum is not a higher order component, and it does not contain any of the encoded data Rather, zero frequency Fourier component 46 contains only information defining the average intensity of the light of SLM pixel array 40. Moreover, zero frequency Fourier component 46 typically contains a significant fraction of the total amount of light in the Fourier spectrum.

In some conventional systems, the intensity of the zero frequency Fourier component in the object beam can cause problems in recording by overexposing the photosensitive recording material. In self-referenced recording, however, such overexposing can be reduced or eliminated because the zero frequency Fourier component is removed from the object beam and used as the reference beam. The need for a separate reference beam and a separate optical path for the reference beam are also eliminated.

In accordance with an embodiment of the invention, a reference beam can be created from the zero frequency component of the Fourier spectrum using a diffusing element (not shown in FIG. 2). The diffusing element can optically direct the zero frequency component of the Fourier spectrum through the same volume of recording material as that illuminated by the higher order Fourier components.

Using the zero frequency component of the Fourier spectrum as a reference beam may address many problems of conventional holographic data storage systems. For instance, if the zero frequency component of the Fourier spectrum is used to produce the reference beam, the system may have only one optical path directed towards the medium. Moreover, the number of optical elements needed by the system, such as costly, high-quality lenses, may be reduced. Thus, a second reference path of optical elements can be eliminated and the size of the system may be reduced significantly. In addition, as mentioned above, the zero frequency component of the Fourier spectrum as a reference beam can reduce overexposure problems conventionally associated with an overly intense object beam.

Figure 3:
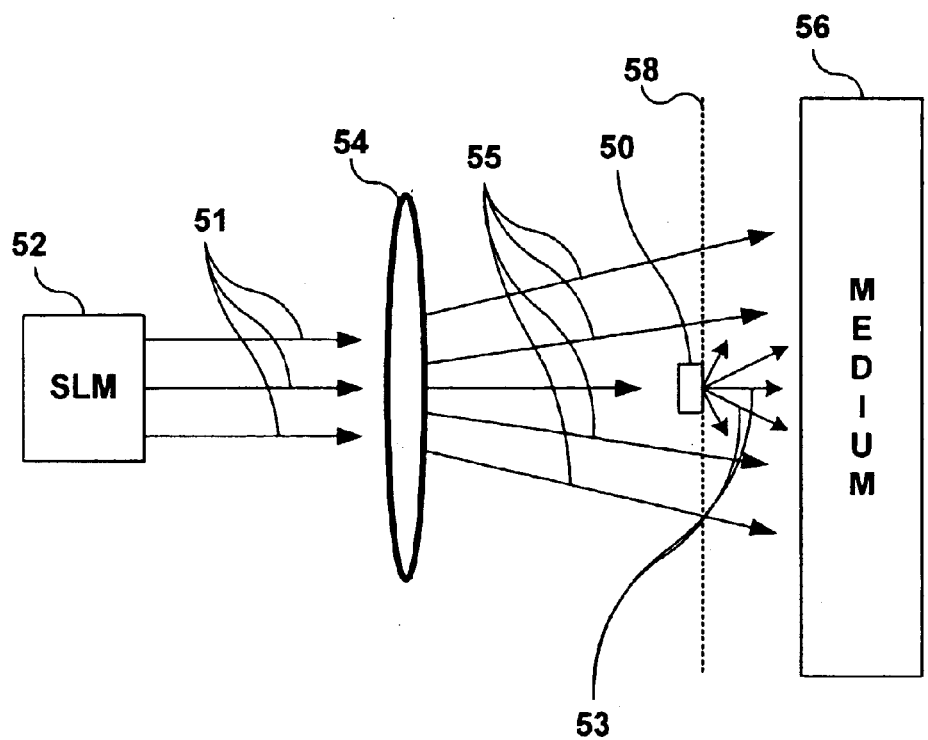
FIGS. 3–6 are side views of exemplary optical arrangements of self-referenced holography making use of a diffusive element.

FIG. 3 is a side view of an exemplary optical arrangement of self-referenced holography making use of a diffusive element 50. SLM 52 encodes bit maps on laser light to define an object beam 51. Fourier transform lens 54 may be positioned approximately one focal length from SLM 52. The data encoded object beam 51 passes through lens 54. Diffusing element 50 is positioned to diffuse only a zero frequency Fourier component of data encoded object beam 51 to create a reference beam 53. Reference beam 53 interferes in medium 56 with the higher order components 55 of the data encoded object beam 51. In other words, reference beam 53 interferes in medium 56 with non-zero frequency Fourier components of the data encoded object beam 51. In this manner, holograms can be created in medium 56. In the configuration of FIG. 3, diffusing element 50 is positioned between Fourier transform lens 54 and medium 56. For example, diffusing element 50 may be positioned at or near Fourier transform plane 58, although the invention is not necessarily limited in that respect.

Figure 4:
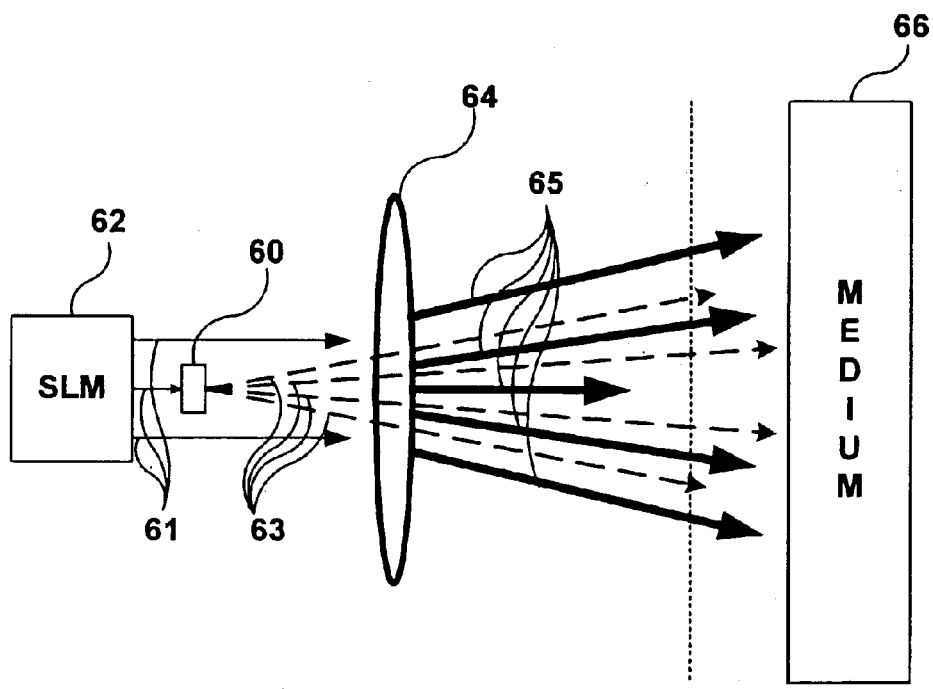

FIG. 4 is another side view of an exemplary optical arrangement of self-referenced holography making use of a diffusive element 60. In the configuration of FIG. 4, diffusing element 60 is positioned between Fourier transform lens 64 and SLM 62. Diffusing element 60 is designed and positioned to diffuse a zero frequency Fourier component of data encoded object beam 61 to create a reference beam 63. Diffusing element 60 may form a diffusing mask that passes light corresponding to higher order components of the object beam, but diffuses light corresponding the zero frequency Fourier component. In some cases, diffusing element 60 diffuses the zero frequency Fourier component in an ordered fashion to create a reference beam having desirable characteristics of phase, amplitude and angles or angular directions. In any case, the reference beam interferes in medium 66 with the higher order components 65 of the data encoded object beam 61. The ability to reconstruct multiplexed holograms may be improved if the reference beam is created to have controlled characteristics of phase, angles, amplitude, and the like.

Figure 5:
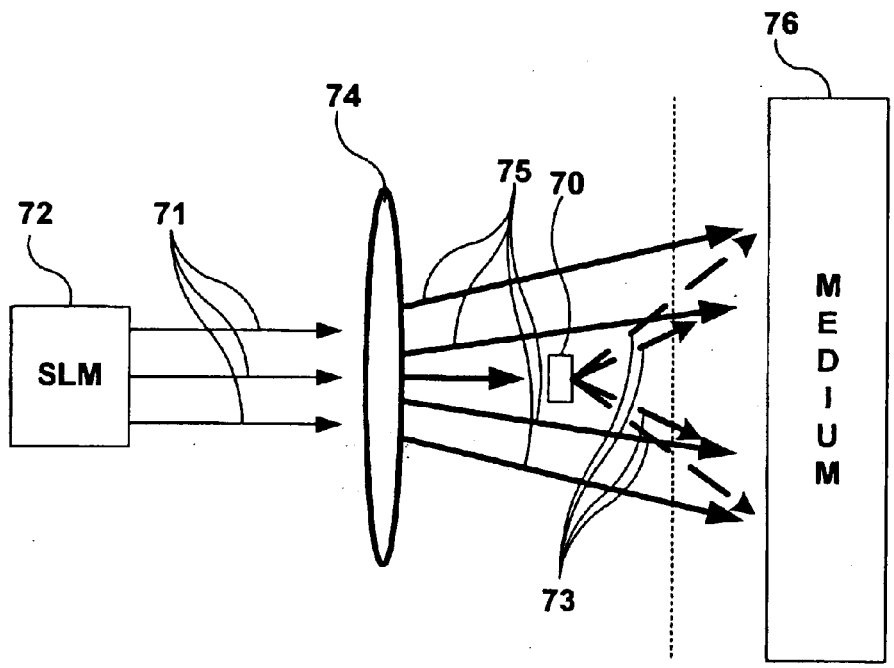

FIG. 5 is another side view of an exemplary optical arrangement of self-referenced holography making use of a diffusive element 70. The arrangement of FIG. 5 is similar to that of FIG. 3 in that diffusing element 70 is positioned between Fourier transform lens 74 and medium 76. In FIG. 5, however, the reference beam 73 is distributed by diffusive element 70 substantially only in angles corresponding to higher order Fourier components 75 of the object beam 71. In that case, diffusive element 70 can be designed to diffuse the zero frequency Fourier component of object beam 71 in an ordered manner in terms of angular distribution. In other words, diffusive element 70 is designed such that reference beam 73 is distributed in angles that correspond to the location of higher order Fourier components 75 on medium 76. Accordingly, exposure in the photopolymer of medium 76 only occurs at such defined locations where the two beams can produce an interference recording. Such a technique may provide improved recording efficiency, in that less photopolymer capacity is used to store a given hologram. Thus, the storage density of medium 76 may be improved. Alignment issues in a system like that of FIG. 5, however, may be complicated relative to a system like that of FIG. 3 because each angularly distributed portion of reference beam 73 may require alignment during readout.

Figure 6:
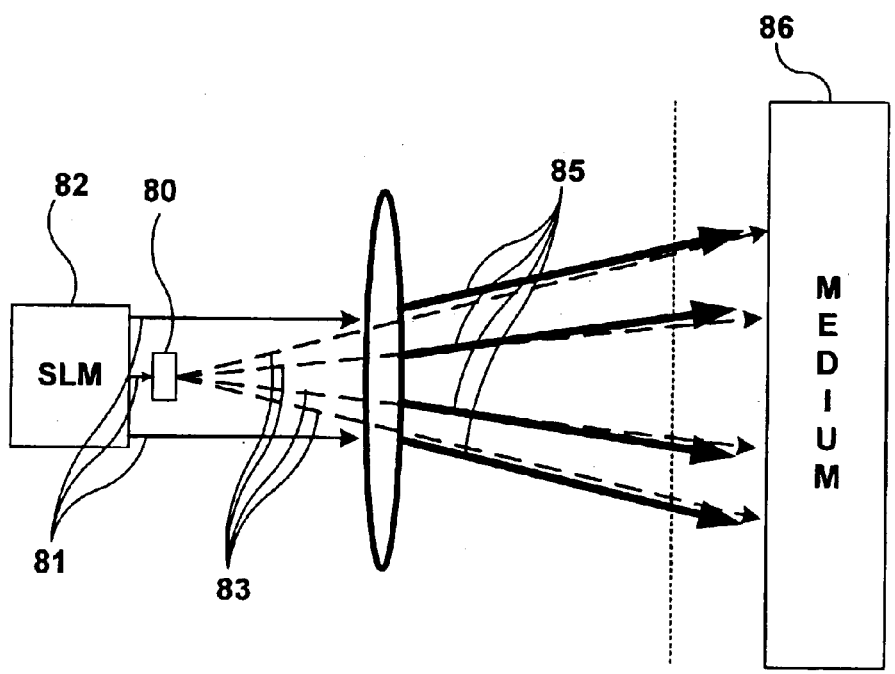

FIG. 6 is another side view of an exemplary optical arrangement of self-referenced holography making use of a diffusive element 80. The arrangement of FIG. 6 is substantially similar to that of FIG. 4, in that diffusing element 80 is positioned between Fourier transform lens 84 and SLM 82. In FIG. 6, however, the reference beam 83 is distributed by diffusive element 80 substantially only in angles corresponding to higher order Fourier components 85 of the object beam 81. In other words, the system of FIG. 6 is like that of FIG. 5 in terms of defining the angular distribution of reference beam 83.

Diffusive element 80 can be designed to diffuse the zero frequency Fourier component of object beam 81 in an ordered manner in terms of angular distribution. In other words, diffusive element 80 is designed such that reference beam 83 is distributed in angles that correspond to the location of higher order Fourier components 85 on medium 86. Accordingly, interference in the photopolymer of medium 86 only occurs at such defined locations. Again, such a technique like that illustrated in FIG. 5 or 6 may provide improved efficiency in that less photopolymer is used to store a given hologram, and therefore storage density may be improved. Alignment issues in a system like that of FIG. 5 or 6, however, may be complicated relative to systems like that of FIGS. 3 and 4.

The diffusive element of the various embodiments described herein may include specific features to improve holographic recording. In general, the diffusive element is used in accordance with the invention to create a reference beam from a zero frequency Fourier component of the data encoded object beam. In different embodiments, however, it can be desirable to create a reference beam that has specific characteristics, e.g., in terms of phase, angles, intensity, or the like. Such characteristics in a reference beam can improve holographic recording, e.g., by improving the ability to multiplex. Thus, such characteristics in a reference beam may increase storage densities associated with a given holographic recording medium, and may also improve storage integrity. The diffusive element may comprise a diffusive film, a replicated element such as a film, glass, polymer, etc., having a replicated surface, a holographic optical element (HOE), optically diffusive particles dispersed in a resin in a random or ordered manner, or the like.

In some cases, the diffusive element used to create a reference beam from a zero frequency Fourier component of the data encoded object beam may randomly diffuse the zero frequency Fourier component. In other cases, the diffusion may be ordered, i.e., specifically defined so that a reference beam with desirable characteristics is obtained. As described with reference to FIGS. 5 and 6, one such ordering may relate to the angles of the reference beam. For example, by creating the diffusive element to cause diffusion of the zero frequency Fourier component of the data encoded object beam only in defined angles, improvements may be achieved in terms of efficient use of the photopolymer recording material, e.g., which can improve storage capacity. In other words, the same amount of photopolymer may store more holograms. Control of the angles, phase, and other characteristics of the reference beam can improve the ability to reconstruct multiplexed bitmaps. In particular, the ability to reconstruct multiplexed holograms may be improved if the reference beam is created to have defined characteristics of phase, angles, amplitude, and the like.

In other cases, other characteristics of the reference beam may be defined by the diffusing element, such as phase, amplitude, or the like. For example, specifically defining the phase of the reference beam to include desired phase content may allow for improved multiplexing in the medium. In that case, the diffusing element may be referred to as a phase mask, e.g., having a checkerboard-like configuration.

A diffusive element in the form of a phase mask refers to a structure that, when illuminated by a phase-ordered beam, yields a phase beam. A phase-ordered beam refers to single ray or set of rays of continuously varying angle, e.g., a plane wave, or a converging or diverging beam. The auto-correlation function of a phase-ordered beam is substantially equal to its cross-sectional area. In contrast, a phase beam refers to a beam having many rays of varying angles of incidence and non-uniform phase content to result in an auto-correlation function adequate for needed selectivity. Beams of deterministic ray and phase content are phase beams. A diffusive element in the form of a phase mask yields a phase beam when illuminated by a phase-ordered beam. The use of phase beams as the reference beam can substantially improve the ability to multiplex bitmaps in the medium.

Phase selectivity can be used to improve differentiation of overlapping holograms in a holographic recording medium. A phase mask, e.g., having a checkerboard-like configuration, can introduce desired phase content into the reference beam which can improve the ability to differentiate holograms of an overlapping series. Such phase correlation multiplexing may be independent of Bragg selectivity techniques, which are sometimes used to facilitate multiplexing of holograms. In any case, introduction of phase selectivity in a self-referenced holographic recording system, e.g., using a diffusive element, may improve the system by enabling shift-multiplexing and potentially higher multiplexing selectivity, i.e., higher storage capacity.

Still other characteristics of the reference beam may also be defined by the diffusing element, such as amplitude of the beam, or possibly other characteristics, such as polarization. If a desired polarization is needed, the diffusive element may comprise a diffusive polarizer. In any case, a diffusive element used in self-referenced holography allows the ability to create reference beams having desirable characteristics, such as randomness, or desired phase, desired amplitude, desired angular distribution, desired polarization, and the like.

Various embodiments of the invention have been described. For example, self-referenced holographic recording techniques have been described for use with holographic data storage media. In particular, self-referenced holography making use of diffusive elements have been described. These and other embodiments are within the scope of the following claims.

What is claimed is:

1. A method comprising:
   optically directing a zero frequency Fourier component of a data encoded object beam using a diffusive element to create a reference beam; and
   illuminating a holographic medium with the reference beam and non-zero frequency Fourier components of the data encoded object beam.

2. The method of claim 1, further comprising optically directing only the zero frequency Fourier component of the data encoded object beam using the diffusive element.

3. The method of claim 1, further comprising transmitting the data encoded object beam and the reference beam along a common optical path.

4. The method of claim 1, wherein the diffusive element is positioned between a Fourier transform lens and a spatial light modulator that encodes the data encoded object beam.

5. The method of claim 1, wherein the diffusive element is positioned between a Fourier transform lens and the holographic medium.

6. The method of claim 1, wherein the diffusive element comprises a phase mask, and the reference beam comprises a phase beam created from the zero frequency Fourier component of the data encoded object beam by the phase mask.

7. The method of claim 1, wherein the diffusive element comprises an element having a replicated surface.

8. The method of claim 1, wherein the diffusive element comprises optically diffusive particles dispersed in a resin.

9. The method of claim 1, wherein the diffusive element comprises a holographic optical element (HOE).

10. The method of claim 1, wherein the reference beam is distributed by the diffusive element substantially only in angles corresponding to higher order Fourier components of the data encoded object beam.

11. The method of claim 1, further comprising substantially randomizing the reference beam with the diffusive element.

12. The method of claim 1, further comprising shift multiplexing by repeating the method of claim 1 at one or more shifted locations on the holographic medium.

13. The method of claim 1, further comprising shift multiplexing by repeating the method of claim 1 following shift of the diffusive element relative to the holographic medium.

14. A holographic data storage system comprising:
   a holographic medium; and
   a diffusive element positioned to create a reference beam from a zero frequency Fourier component of a data encoded object beam, wherein the reference beam and non-zero frequency Fourier components of the object beam interfere in the holographic medium to create a hologram.

15. The holographic data storage system of claim 14, wherein the reference beam comprises randomly scattered light.

16. The holographic data storage system of claim 14, further comprising:
   a laser to produce light;
   one or more optical elements to condition the light produced by the laser to create the object beam; and
   a data encoder to encode data in the object beam.

17. The holographic data storage system of claim 16, further comprising a data detector for detecting data in the hologram when the hologram is illuminated by the reference beam only.

18. The holographic data storage system of claim 17, wherein the data detector includes a camera.

19. The holographic data storage system of claim 16, wherein the data encoder includes a spatial light modulator.

20. The holographic data storage system of claim 14, wherein the diffusive element is positioned to create a reference beam from only a zero frequency Fourier component of the data encoded object beam.

21. The holographic data storage system of claim 14, further comprising a Fourier transform lens and a spatial light modulator to encode the object beam, wherein the diffusive element is positioned between the Fourier transform lens and spatial light modulator.

22. The holographic data storage system of claim 14, further comprising a Fourier transform lens and a spatial light modulator to encode the object beam, wherein the diffusive element is positioned between the Fourier transform lens and the holographic medium.

23. The holographic data storage system of claim 14, wherein the diffusive element comprises a phase mask, wherein the reference beam comprises a phase beam created from the zero frequency Fourier component of the object beam by the phase mask.

24. The holographic data storage system of claim 14, wherein the diffusive element comprises an element having a replicated surface.

25. The holographic data storage system of claim 14, wherein the diffusive element comprises diffusive particles dispersed in a resin.

26. The holographic data storage system of claim 14, wherein the diffusive element optically directs the zero frequency Fourier component of the object beam in a phase selective manner such that the reference beam comprises a phase beam.

27. The holographic data storage system of claim 14, wherein the reference beam is distributed by the diffusive element substantially only in angles corresponding to higher order Fourier components of the object beam.

28. The holographic data storage system of claim 14, wherein the reference beam interferes with only higher order components of the object beam in the holographic medium.

29. A method comprising:
   optically directing a zero frequency Fourier component of a first optical beam using a phase mask to create a second optical beam; and
   illuminating a holographic medium with the second optical beam and non-zero frequency Fourier components of the first optical beam.

* * * * *